THYRISTOR SWITCH CIRCUIT

Filed March 22, 1967

INVENTORS L. E. CAMERON
W. B. HARRIS
R. P. MASSEY
F. J. ZGEBURA

BY Walter M. Hill
ATTORNEY

United States Patent Office 3,488,522
Patented Jan. 6, 1970

3,488,522

THYRISTOR SWITCH CIRCUIT

Leon E. Cameron, Morristown, William B. Harris, Bernardsville, Richard P. Massey, Westfield, and Frank J. Zgebura, Whippany, N.J., assignors to Bell Telephone Laboratories, Incorporated, Murray Hill and Berkeley Heights, N.J., a corporation of New York Filed Mar. 22, 1967, Ser. No. 625,227
Int. Cl. H03k 17/04
U.S. Cl. 307—252 14 Claims

ABSTRACT OF THE DISCLOSURE

A thyristor switch circuit having a conventional reverse current turn-off circuit means in which both the turn-off time and the rate effect (*dv/dt*) capacities are improved by connecting diodes in circuit with various terminals of the thyristor. The recovery times of these diodes are definitely related to the recovery times of the thyristor junctions as well as of each other to steer the turn-off currents in proper sequence through all of the thyristor junctions to rapidly remove their stored charges.

BACKGROUND OF THE INVENTION

This invention relates to an improved semiconductor switching circuit capable of operating at high speeds in high power circuits.

Semiconductor switches of the prior art have used a variety of semiconductor devices. The semiconductor device most commonly used for this purpose is the four-layer PNPN device presently known in the art as a silicon controlled rectifier or a thyristor. As is well known, these devices are usually of the three terminal type and have properties somewhat analogous to the gas-filled thyratron and, like the thyratron, remains conductive once it is switched on until a turn-off mechanism is operated. Although the speed with which the thyristor may operate is inherently much greater than that of which the thyratron is capable, some modern applications require that these speeds be considerably increased over those for which even the thyristor is inherently capable. The use of thyristors, particularly in high voltage series strings, has been hampered by two fundamental and interrelated problems. The first of these problems relates to the dynamic breakdown characteristic of these devices, also known as their rate effect or their *dv/dt* effect. The second problem relates to the minority carrier storage effect on the ability of these devices to quickly regain their forward blocking characteristic after forward conduction.

The first problem relating to the dynamic breakdown characteristic arises when an initially deenergized device is subjected to a sufficiently fast rate of change of forward anode to cathode voltage. This gives rise to a displacement current through the space charge or the depletion layer capacitance of the device to falsely trigger it into conduction. The second problem relating to the minority carrier storage effect arises by reason of a stored charge developed when the device has been in forward conduction. This charge must be essentially eliminated before the device can regain its forward blocking characteristic. In order to increase the switching speed of these devices, it is necessary that not only their dynamic breakdown capability be considerably increased but the time required to restore their forward blocking properties must also be materially reduced. There have been several prior attempts to improve these properties in a practical way.

Representative of some of these prior attempts are disclosed in two published articles. Circuits having thyristors embodying the "shorted emitter" principle are described by Messrs. R. W. Aldrich and N. Holonyak in an article entitled "Two-Terminal Asymmetrical and Symmetrical Silicon Negative Resistance Switches" published in vol. 30, No. 11 of the Journal of Applied Physics for November 1959, pp. 1819 through 1824. The fact that a shorted emitter tends to improve the rate effect capability of a thyristor is mentioned in the first column of p. 1824 of this article. The second article under the authorship of Richard A. Stasior appeared in Electronics for Jan. 10, 1964, pp. 30 through 33 and is entitled "How to Suppress Rate Effect in PNPN Devices." Further improvements in this art are disclosed in the copending application of W. B. Harris, R. P. Massey and F. J. Zgebura, filed Mar. 25, 1966, Ser. No. 537,544 and in an application of D. V. Brockway, filed May 10, 1966 Ser. No. 549,030, both of these applications being assigned to the same assignee as the present invention.

Although a shorted emitter tends to improve the rate effect capability of thyristor switches, this is generally at the expense of other desirable circuit characteristics of the switch. While the inventions of the two copending applications made substantial improvements in the dynamic characteristics of these switches, these improvements, at least in part, were generally more easily realized with thyristors of the non-shorted type. In some circuits there is an advantage in using the shorted emitter thyristor but, as will be described more fully later, the relatively low impedance between the gate and cathode of such a thyristor tends to limit the full capability of the switch circuit to recover as well as to limit the maximum rate effect capability of which the circuit can be capable.

SUMMARY OF THE INVENTION

The invention comprises a thyristor switch circuit having a conventional reverse current turn-off means and an impedance between the gate and cathode of the thyristor to reduce false triggering from the rate effect. Both the rate effect and the turn-off capabilities are improved by connecting one diode between the thyristor gate and cathode, a second diode between the thyristor gate and anode and a third diode in series with the impedance existing between the gate and cathode. The reverse recovery time of the thyristor middle junction must be less than that of the first diode but greater than that of the second diode while the recovery time of the third diode is less than that of the first diode. In one embodiment of the invention where the gate to cathode impedance is an inherent internal impedance the third diode is connected directly in series with the cathode terminal of the thyristor so that the reverse current ordinarily bypassed around the first diode by the impedance may be blocked by the recovery of the third diode. In another embodiment where the gate to cathode impedance is an external resistor this third diode may be connected directly in series with that resistor. In either case, the function of this diode is to isolate this impedance when the third diode recovers from the flow of reverse current so as to remove the impedance as a shunt around the first diode.

BRIEF DESCRIPTION OF THE DRAWINGS

The invention may be better understood by reference to the accompanying drawings in which.

DETAILED DESCRIPTION

Figure 1:
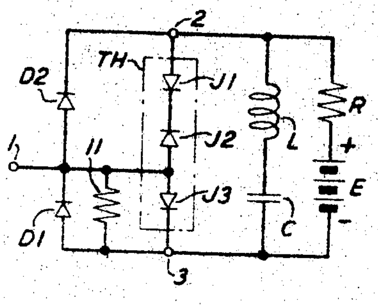
FIG. 1 (PRIOR ART)
FIGS. 1 and 2 disclose improved circuits of the earlier copending applications mentioned above.

FIG. 1 shows a circuit embodying the principles of the above-mentioned Harris et al. copending application. A thyristor TH is shown in its equivalent diode configuration, junction J1 comprising the upper diode while junctions J2 and J3 represent the middle and lower diodes, respectively. It will be recognized that this is representative of a PNPN thyristor. The anode terminal 2 is connected to the anode of junction J1 while the anodes of junctions J2 and J3 are connected to the gate terminal 1 and the cathode terminal 3 is connected to the cathode of junction J3. Power is supplied from the direct voltage source E in series with a load resistor R and the anode and cathode terminals 2 and 3, respectively, of the thyristor TH. When the thyristor is fired, current flows through the load resistor and when the thyristor is caused to recover, this current ceases. A conventional turn-off circuit comprising inductor L and capacitor C is also connected in series with the anode and cathode terminals 2 and 3 of the thyristor. A first diode D1 is connected between the cathode terminal 3 and the gate terminal 1 while a second diode D2 is connected between the gate terminal 1 and the anode terminal 2. As described in the copending application, the reverse recovery time of junction J2 must be less than that of diode D1 but greater than that of diode D2. A single thyristor in this circuit can work quite satisfactorily with a relatively high impedance between the gate and cathode terminals. However, where a series of these thyristors are used in a high voltage string, an external resistor 11 must be connected between the gate and cathode terminals as shown in FIG. 1.

Because an understanding of the operation of FIG. 1 is essential to understand the present invention, the operation of FIG. 1 will be briefly described. While the thyristor switch is open, capacitor C is charged to voltage E through resistor R and its series inductor L. The instant that the switch is closed by reason of applying a positive-going pulse to gate terminal 1, the impedance between terminals 2 and 3 becomes very low causing a ringing current to immediately start, the first half cycle flowing from capacitor C through inductor L and in the forward direction through the thyristor switch TH, adding to the normal load current coming from source E through resistor R. At the beginning of the second half cycle, the ringing current quickly exceeds the normal load current, thereby providing a net reverse current through all three junctions of the thyristor flowing from the cathode terminal 3 to the anode terminal 2. As described in the copending application, junction J3 quickly recovers and, since this current is also a reverse current for junction J1, it will partially recover during the time that junction J3 is carrying reverse current. As junction J3 recovers, current is diverted through diode D1 and through junction J1 by way of junction J2 thereby forcing junction J1 to complete its recovery. At this point, the reverse current is now diverted through diode D2, thereby restoring additional charge in the slow recovery diode D1. As the third half cycle of ringing current begins, current resumes in the forward direction through junction J1 and in the reverse directions through junction J2 and diode D1, thereby forcing junction J2 to recover. Diode D1 now completes its recovery by recombination. This circuit works quite satisfactorily in all cases except where shorted emitter type thyristors or external resistors are used, such as resistor 11, having an impedance in the order of approximate 100 ohms or lower. In this case, it will be evident that the impedance 11 bypasses part of the ringing current which should normally be caused to flow through diode D1 to produce enough hole storage to make certain that this diode will recover more slowly than the middle junction J2 of the thyristor. As explained in the copending application, the purpose for the slow recovery of diode D1 is to permit the complete recovery of junction J2 as well as to provide a low impedance between the gate and cathode terminals for a short interval after the thyristor recovers to improve the rate effect capability of the circuit. The effect of the shunting impedance is to defeat this desirable objective.

Figure 2:
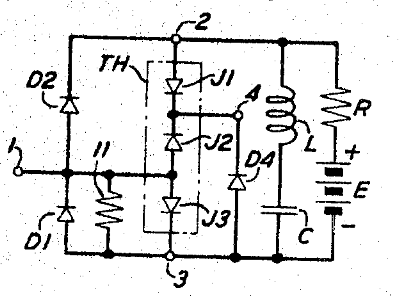
FIG. 2 (PRIOR ART)

The circuit of FIG. 2 embodies the principles of the copending Brockway application. It differs from the circuit of FIG. 1 only in the addition of the anode gate terminal 4 and its series diode D4. The operation of this circuit on recovery is essentially the same as described for FIG. 1 up to the point where junction J3 has completed its recovery. Promptly after junction J3 had recovered, the reverse current is diverted through diode D4 and in the reverse direction through junction J1 to complete its recovery without permitting forward current to flow through junction J2. It should be noted that forward current flowing through junction J2 only increases its hole storage and retards its recovery. Immediately after junction J1 has recovered, the reverse current flows through diode D4, in the reverse direction through junction J2 and back to the resonant circuit by way of diode D2, thereby forcing a prompt recovery of junction J2. Current now continues by way of diodes D1 and D2 to store the necessary charge in diode D1 to improve the rate effect capability. As described for FIG. 1, the impedance 11 in FIG. 2 has the same deleterious effect on the action of diode D1. While impedance 11 is shown as an external resistor connected between the leads to terminals 1 and 3, it may comprise only an inherent internal resistance or both internal and external as illustrated, for example, in FIG. 3.

Figure 3:
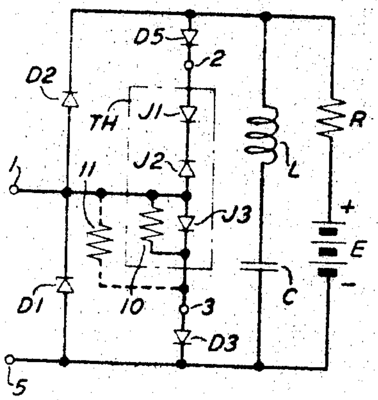
FIG. 3 discloses the improvements of the circuit of FIG. 1 provided by this invention.

FIG. 3 shows the improvement provided by this invention for the circuit shown in FIG. 1. In this case an additional diode D3 is connected in series with the turn-off circuit LC and the inherent internal resistance 10 of the shorted emitter thyristor. In order for this diode to work properly it should have a reverse recovery time less than that of diode D1 but greater than that of junction J3 of the thyristor. A further improvement of the reverse capability of the switch is provided by connecting another diode D5 in series with the anode terminal 2 of the thyristor and the diode, to operate properly, should have a reverse recovery time less than that of junction J1 but greater than that of junction J3. All other parts of this circuit are the same as shown in FIG. 1. It may be added that, for certain application requirements, a lower impedance between the gate and cathode may be necessary. For this purpose an external resistor 11 may be connected as shown in FIG. 3, this resistor being in parallel with the internal resistance 10. Because of the addition of diodes D3 and D5, the recovery sequence of the several junctions and diodes is somewhat modified over that of the circuit of FIG. 1. During the second half cycle of the turn-off circuit LC, a reverse current is being driven through the thyristor and in the reverse direction through diodes D3 and D5. This current forces junction J3 to completely recover and diodes D3 and D5 and junction J1 to partly recover. The small charge left on diode D3 acts as a back-bias for junction J3 to further improve the rate effect capability of the circuit. The second half cycle of ringing current now continues through diode D1, junctions J2 and J1 and in the reverse direction through diode D5, thereby forcing its recovery and permitting some further recovery for junction J1. Also this portion of the second half cycle stores some charge in diode D1. As this half cycle of ringing current continues, it is diverted through diodes D1 and D2, thereby storing additional charge in diode D1 to improve the rate effect capability of the circuit. It should be especially noted at this point that, if the impedance 10 between the gate and cathode is sufficiently low, some of this reverse ringing current will be diverted in the reverse direction through diode D3, impedance 10 and the diode D2, thereby forcing a rapid recovery of diode D3. Since diode D3 recovers before diode D1, it will now permit the entire remaining portion of this half cycle of ringing current to flow through diode D1 rather than have part of it diverted around the shunt path provided by resistance 10. This insures sufficient charge in diode D1 to improve the rate effect capability of the circuit.

During the third half cycle of ringing current, current flows through the middle junction J2 by way of diode D5, junction J1 and diode D1, thereby forcing a prompt recovery of junction J2. It will thus be seen that diode D3 prevents the undesired diversion of charging current around diode D1 while diode D5, which is made to recover more rapidly than junction J1, acts to effectively improve the recovery of junction J1, even though junction J1 itself is not completely recovered. The fact that diode D5 can recover so rapidly limits the amount of recovery current which must flow through junction J2 in its forward direction, thereby reducing the stored charge in junction J2 and permitting its more rapid recovery.

Figure 4:
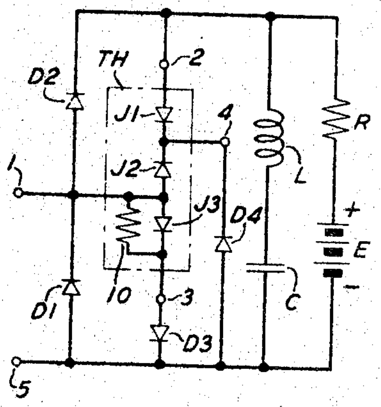
FIGS. 4 and 5 disclose improvements of the circuit of FIG. 2 provided by this invention.

FIG. 4 shows how the circuit of FIG. 2 is improved by this invention. From the description given for FIGS. 2 and 3, both the construction and the circuit operation of FIG. 4 will become quite evident. During the second half cycle of ringing current from the turn-off circuit LC, junction J3 is caused to promptly recover leaving some charge on diode D3 to back-bias junction J3 to further improve the rate effect capability. Current is now diverted through diode D4 and junction J1 to force a prompt recovery of junction J1. When junction J1 recovers, current flows through diode D4, through junction J2 and through diode D2 to force a prompt recovery of junction J2. This half cycle of ringing current now continues through diodes D1 and D2 to store further charge in diode D1. It should be again noted that if the inherent internal impedance 10, or any external impedance shunting it, causes a substantial diversion of forward current through diode D1, diode D3 will be caused to promptly recover and prevent any further current diversion. A diode such as diode D5 in FIG. 3 is unnecessary in this case since diode D4 forces a prompt recovery of junction J1 in accordance with the invention of the copending Brockway application.

Figure 5:
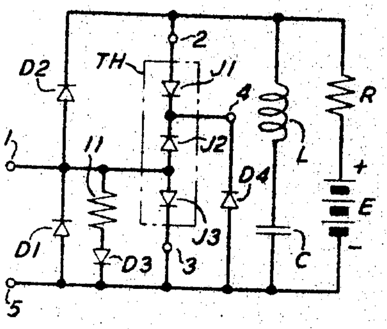

In the event that the internal impedance 10 of the thyristor is relatively high but, for some circuit reasons, an effective lower impedance must exist between the gate and cathode terminals, it may be connected as resistor 11 in FIG. 5. In this case diode D3 need not also carry the entire load and ringing currents flowing through the thyristor itself so it may be a very fast recovery diode with a much smaller current rating connected as shown in FIG. 5 in series with the impedance 11 appearing between the gate and cathode terminals. The operation of this diode is the same as has been previously described for FIGS. 3 and 4 and all other current sequences during the recovery period are the same as already described for FIG. 4.

Figure 6:
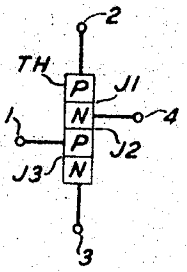
FIG. 6 discloses a more conventional representation of a semiconductor thyristor.

FIG. 6 shows a more conventional representation of a thyristor such as may be used in any of the FIGURES 1 through 5. In this representation, a four-layer thyristor having alternate P and N regions is shown, the four layers having three junctions J1, J2 and J3 between them. The upper P layer is connected to the anode terminal 2 while the lower P layer is connected to the gate terminal 1. The upper N layer is connected to the anode gate terminal 4 while the lower N layer is connected to the cathode terminal 3. Of course, the anode gate terminal 4 would not be used in the circuits of FIGS. 1 and 3 but the structure is otherwise the same.

To illustrate the improvement afforded by this invention where emitter shorting impedances exist, a group of shorted emitter thyristors was operated first in the circuit of FIG. 1 and then in the circuit of FIG. 3. Measurements of the minimum recovery times and the maximum rate effect capability ($dv/dt$) showed that the recovery times in the circuit of FIG. 3 were quite uniformly about one-half those obtained in the circuit of FIG. 1 while the rate effect capability increased from eight percent to forty-five percent, averaging about twenty-four percent.

From the foregoing description of this invention it will be evident to those skilled in this art that various modifications may be made employing the principles of this invention without departing from the scope of the invention.

What is claimed is:

1. A switch circuit comprising a thyristor having four layers forming three junctions between said layers, the middle junction existing between the second and third layers having an inherent reverse recovery time, an anode terminal connected to the first layer, a gate terminal connected to the third layer, a cathode terminal connected to the fourth layer, a turn-off circuit connected in series with said anode and cathode terminals capable of driving a reverse current from said cathode terminal to said anode terminal, a first diode connected between said cathode and gate terminals, a second diode connected between said gate and anode terminals, the reverse recovery time of said middle junction being less than that of said first diode and greater than that of said second diode, an impedance between said gate and cathode terminals, and a third diode connected in series with said impedance and said turn-off circuit to isolate said impedance from reverse current after said third diode recovers, said third diode having a reverse recovery time less than that of said first diode.

2. The combination of claim 1 wherein said impedance comprises an inherent, internal resistance shunting the gate and cathode terminals and said third diode is connected in series with said cathode terminal so as to also be in series with said impedance, the reverse recovery time of said third diode also being greater than that of the junction between said third and fourth layers.

3. The combination of claim 2 and a fourth diode connected in series with said anode terminal, the reverse recovery time of which is less than that of the junction between said first and second layers but greater than that of the junction between said third and fourth layers.

4. The combination of claim 1 wherein said impedance comprises an external resistor connected in series with said third diode between said gate and cathode terminals.

5. The combination of claim 4 and a fourth diode connected in series with said anode terminal, the reverse recovery time of which is less than that of the junction between said first and second layers but greater than that of the junction between said third and fourth layers.

6. The combination of claim 1 wherein said impedance comprises an inherent, internal resistance which shunts the gate and cathode terminals, said third diode is connected in series with said cathode terminals so as to also be in series with said impedance, the reverse recovery time of said third diode also being greater than that of the junction between said third and fourth layers, said second layer is connected to an anode gate terminal, and a fourth diode is connected between said cathode and anode gate terminals, the reverse recovery time of said fourth diode being less than that of said middle junction.

7. The combination of claim 1 wherein said impedance comprises an external resistor connected in series with said third diode between said gate and cathode terminals, said second layer is connected to an anode gate terminal, and a fourth diode is connected between said cathode and anode gate terminals, the reverse recovery time of said fourth diode being less than that of said middle junction.

8. A switch circuit of the type having a thyristor with four layers, the first, third and fourth layers having accessible terminals for connection to external circuits, the second and third of said layers joined in a junction having an inherent reverse recovery time, an impedance between said third and fourth layers and a turn-off circuit connected in series with the terminals of the first and fourth of said layers capable of driving a reverse current therethrough, said turn-off circuit being characterized in that a first diode is connected between the terminals of the third and fourth layers, a second diode is connected between the terminals of the first and third layers and a third diode is connected in series with said impedance and said turn-off circuit, the inherent reverse recovery time of said junction being less than that of said first diode and greater than that of said second diode while the reverse recovery time of said third diode is less than that of said first diode.

9. The combination of claim 8 in which said impedance comprises an inherent, internal resistance shunting said third and fourth layers and said third diode is connected in series with the terminal of said fourth layer so as to also be in series with said impedance, the reverse recovery time of said third diode also being greater than that of the junction between said third and fourth layers.

10. The combination of claim 9 and a fourth diode connected in series with a terminal of said first layer, the reverse recovery time of which is less than that of the junction between said first and second layers but greater than that of the junction between said third and fourth layers.

11. The combination of claim 8 wherein said impedance comprises an external resistor connected in series with said third diode between the terminals of said third and fourth layers.

12. The combination of claim 11 and a fourth diode connected in series with the terminal of said first layer, the reverse recovery time of which is less than that of the junction bewteen said first and second layers but greater than that of the junction between said third and fourth layers.

13. The combination of claim 8 wherein said impedance comprises an inherent, internal resistance which shunts the terminals of said third and fourth layers, said third diode is connected in series with the terminal of said fourth layer so as to also be in series with said impedance, the reverse recovery time of said third diode also being greater than that of the junction between said third and fourth layers, said second layer is connected to an additional accessible terminal, and a fourth diode is connected between the terminals of said second and fourth layers, the reverse recovery time of said fourth diode being less than that of the junction between said second and third layers.

14. The combination of claim 8 wherein said impedance comprises an external resistor connected in series with said third diode between the terminals of said third and fourth layers, said second layer is connected to an additional accessible terminal, and a fourth diode is connected between the terminals of said second and fourth layers, the reverse recovery time of said fourth diode being less than that of the junction between said second and third layers.

References Cited

UNITED STATES PATENTS 3,434,022 3/1969 Byrd ------------ 307—305 X

DONALD D. FORRER, Primary Examiner

U.S. Cl. X.R.

307—284, 300, 305